(12) United States Patent
Kuhara et al.

(10) Patent No.: US 6,437,415 B1
(45) Date of Patent: *Aug. 20, 2002

(54) PHOTODIODE AND PHOTODIODE MODULE

(75) Inventors: Yoshiki Kuhara; Hitoshi Terauchi, both of Osaka (JP)

(73) Assignee: Sumitomo Electric Industries, Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,541

(22) Filed: May 28, 1999

(30) Foreign Application Priority Data

Jun. 22, 1998 (JP) .............................. 10-174227

(51) Int. Cl.[7] ................................ H01L 31/00
(52) U.S. Cl. ................. 257/458; 257/431; 257/458; 257/461; 257/490
(58) Field of Search ................. 257/451, 452, 257/458, 461, 490

(56) References Cited

U.S. PATENT DOCUMENTS 3,978,511 A 8/1976 Digoy
5,420,418 A 5/1995 Fujimura et al.
6,084,661 A * 7/2000 Mendelson et al. ........... 356/41

FOREIGN PATENT DOCUMENTS

| EP | 0 421 403 A2 | 4/1991 |
| EP | 0 473 197 A1 | 5/1992 |
| JP | 0411479 A | 4/1992 |

OTHER PUBLICATIONS

Patent Abstract of Japan, 014:071, Feb. 9, 1990 (Abstract–JP 01 289677 A).

* cited by examiner

Primary Examiner—Eddie Lee
Assistant Examiner—N. Drew Richards
(74) Attorney, Agent, or Firm—Smith, Gambrell & Russell

(57) ABSTRACT

Besides the central pn-junction and the central electrode, a PD chip has a peripheral pn-junction and a peripheral electrode which do not appear on the sides. The ends of the peripheral pn-junction are covered with a protection layer for preventing self-shortcircuit. A reverse bias is applied to the peripheral electrode for making a wide depletion layer beneath the peripheral pn-junction. Extra carriers generated by peripherally-incidence rays are fully absorbed by the peripheral depletion layer and annihilated by the reverse bias.

6 Claims, 7 Drawing Sheets

PHOTODIODE AND PHOTODIODE MODULE

BACKGROUND OF THE INVENTION

1. Field of the Invention

This invention relates to a photodiode (PD) and a photodiode module in optical communication networks, in particular, to a photodiode which is immune from the delay of response due to the diffusion of carriers generated at the periphery of the light receiving region. Rays emitting from an optical fiber or a laser diode (LD) are usually converged for entering the center of the PD chip. However, a part of the rays go into the PD chip at the periphery and make carriers (pairs of electron and hole) at the periphery. Since no reverse bias is applied to the peripheral region of the PD chip, the carriers trek to a p-region or an n-region by diffusion and make a delay photocurrent. The delay of response caused by the peripheral carriers is fatal to high-speed optical communication.

This application claims the priority of Japanese Patent Application No. 10-174227 (174227/98) filed on Jun. 22, 1998 which is incorporated herein by reference.

2. Description of Related Art

FIG. 1 is a schematic sectional view of a prior front surface incident type photodiode. A p-region is formed by diffusing a p-type dopant in an n-type substrate. The p-type dopant is, for example, zinc (Zn), cadmium (Cd) or magnesium (Mg). Since Zn is most favorably employed as a p-dopant, the problem will be explained on a Zn-doped PD. Of course, a similar problem accompanies a PD which has a p-substrate and an n-region produced on the p-substrate by diffusing an n-dopant. Here, a prior PD having an n-substrate and a p-region made on the n-substrate by diffusion is explained. The PD has an n-type substrate 1 and an n-type light receiving layer 2 piled on the substrate 1. The n-type light receiving layer 2 has a plurality of epitaxial layers. A p-region 3 is formed by diffusing Zn atoms at the center of the light receiving layer 2. A pn-junction is formed between the n-type light receiving layer 2 and the p-region 3. A p-electrode 4 is fabricated on a part or on the whole periphery of the p-region 3. An n-electrode 5 is produced overall on the bottom of the n-type substrate 1. The peripheral part of the top surface of the light receiving layer 2 is covered with an insulating protecting layer which is not shown in FIG. 1. The PD is reversely biased; i.e., a positive n-electrode 5 and an negative p-electrode 4. The reverse bias makes a depletion layer 6 which lacks carriers, i.e., electrons and holes. The depletion layer 6 is the region between the dotted line w—w and the solid line u—u. The outside of the line w—w is still the n-light receiving layer 2. The inside of the line u—u is the p-type light receiving region 3. A PD device has such a PD chip stored in a package.

The definitions of the depletion layer, the p-type region and the n-type region are first clarified. The n-type region has electrons as major carriers and holes as minority carriers. An n-type semiconductor is produced by doping with an n-type dopant into a semiconductor. The p-region has holes as major carriers and electrons as minority carriers. A p-type semiconductor is produced by doping a semiconductor with a p-type dopant. When a p-region is partially made in an n-type semiconductor, an n-region, a p-region and a pn-junction are formed at the same time. The words are not always used in their correct meaning. Their correct definitions are required for explaining the exact significance of the present invention. The product "np" of the electron concentration "n" and the hole concentration "p" is constant in a semiconductor which depends only upon temperature. A pn-junction is a continual curved plane at which the number of free electrons is equal to the number of free holes (n=p), where n is an electron concentration and p is a hole concentration. Both electrons and holes are sparse at the pn-junction because of n=p. At the pn-junction, a p-dopant density Na (acceptor density) is equal to an n-dopant density Nd (donor density). The pn-junction has a voltage drop which is nearly equal to the band gap.

When a reverse bias is applied between an anode (minus) and a cathode (plus), most of the bias voltage is applied to the pn-junction. The reverse bias pulls holes toward the p-electrode (anode) and pulls electrons toward the n-electrode (cathode). The reverse bias sweeps up the carriers from the pn-junction. There are some portions which has dopant levels (donors and acceptors) but has little carriers in the vicinity of the pn-junction. The parts lack of carriers in spite of high density donors or acceptors. The depopulated part near the pn-junction is called a "depletion layer" 6. Thus, the depletion layer exists both above and below the pn-junction or both at the n-side and the p-side on the pn-junction. The upper depletion layer and the lower depletion layer sandwich the pn-junction. The thickness of the depletion layer increases in accordance with the reverse bias. But the upper depletion layer and the lower depletion layer don't have an equal thickness. Asymmetry of the depletion layer results from the difference of the dopant densities Na and Nd. The thicknesses of the n-side depletion layer and the p-side depletion layer are denoted by s and t. The neutrality condition requires sNd=tNa. Gauss theorem gives $V=e(s^2Nd+t^2Na)/\in$ at the depletion layer, where e is an electron charge, V is the reverse bias and $\in$ is a dielectric constant of the semiconductor. The n-side depletion layer thickness s and the p-side depletion layer thickness t are, $$s=[\in VNa/\{eNd(Nd+Na)\}]^{1/2} \quad (1)$$

$$t=[\in VNd/\{eNa(Nd+Na)\}]^{1/2} \quad (2)$$

$$s+t=[\in V(Nd+Na)/\{eNdNa\}]^{1/2} \quad (3)$$

An increase of the reverse bias V enhances both the p-side depletion layer t and the n-side depletion layer s in proportion to the square root of V. The depletion layer widens in both directions from the pn-junction. The pn-junction intervenes in the depletion layer. But each thickness is not equal (s≠t). In the case of the PD having an n-type substrate, the light receiving layer on the substrate is also n-type. The electron concentration is low (about $10^{15}$ cm$^{-3}$) in the n-light receiving layer. But the p-region is produced by doping a high density p-dopant of about $10^{18}$ cm$^{-3}$. The acceptor density Na on the p-side is about thousand times as much as the donor density on the n-side near the pn-junction (Na=Nd). The n-side thickness s is much larger than the p-side thickness t. The p-side depletion layer thickness t is negligible small. The depletion layer mainly expands in the n-type region due to the sparse donors. The boundary on the p-side of the depletion layer is nearly equal to the pn-junction itself. In FIG. 1, the curved solid line u—u is inherently the upper boundary of the depletion layer. But the curved solid line u—u is substantially the pn-junction. The other curved dotted line w—w is the lower boundary (n-side boundary) of the depletion layer.

In FIG. 1, the cross-hatched part enclosed by the solid line u—u is the p-region 3. The region outside of the dotted line w—w is the n-type part of the light receiving layer 2. The region sandwiched by the solid line u—u and the dotted line w—w is the depletion layer 6.

Signal light is carried by an optical fiber or so in optical communication. The propagating signal light goes out from the end in air and disperses into rays. Some incidence rays go into the central part of the PD chip. The depletion layer 6 absorbs the central rays and makes pairs of electron 8 and hole 7 by the band gap transition. The depletion layer 6 has no carriers. The newly-borne carriers (electrons and holes) cannot collide and recombine with an extra counterpart in the depletion layer 6. The electrons 8 progress to the n-region (downward) by the reverse bias. The holes 9 make their way to the p-region 3 by the reverse bias. When an electron invades in the n-region, a elementary charge current e is induced. When a hole arrives at the p-region 3, another elementary charge current e flows. This is a "photocurrent". The current is also a signal current, since the intensity is in proportion to the signal intensity.

It would be convenient, if the rays entered only the central part of the PD. Some rays induce a problem by going into a periphery of the PD chip. For example, the rays going out of the optical fiber are converged by a lens. But the incidence rays Q have some extension on the PD chip. Some leak rays go into a peripheral part 10 of the n-type light receiving layer 2 outside of the deletion layer 6. The rays induce pairs of electron and hole. Since the peripheral part 10 is an n-type region and the major carrier is electron, the borne electrons are not moved. The borne holes 9 which are minority carriers move in the n-light receiving region 2 by diffusion along the difference of concentration. Since the movement is caused by diffusion, the directions of the movement are random and the speed of the movement is slow. Some holes meet with free electrons and recombine with the electrons in the process of the diffusion. A part of the holes 9 arrives at the depletion layer 6. The holes are accelerated toward the p-region 3 by the reverse bias in the depletion layer 6. When the holes reach the p-region 3, an extra photocurrent of a unit charge e flows in the PD. The extra photocurrent is caused by the stray holes diffusing slowly from the periphery. The extra photocurrent delays far from the normal photocurrent caused by the pairs of electron and hole borne in the depletion layer 6.

The delayed photocurrent induces a tail part following a signal. In the case of a pulse signal, an extra photocurrent flows after the incident light has been extinguished. The falling of the signal is delayed by the extra current which is induced by the holes generated by the peripheral rays. The pulse width is increased to be longer than the original width by the tail current. In the case of analog signals, the delayed tail current causes signal distortion. The signal distortion invites a more serious problem for faster signal rates. Further, in the case of analog signals with a wide dynamic range, the tail current is confused with a small inherent signal.

FIGS. 2(a) and (b) demonstrate the tail current J. FIG. 2(a) is a photodiode driving circuit for applying a reverse bias. A photodiode (PD) and a load resistor RL are interposed between the source voltage Vpd and the ground. An output Vout is extracted at the point "a" connecting the anode of the PD to the resistor. FIG. 2(b) shows the output Vout for a square input pulse. The dotted line denotes the square input. Even an ideal PD would make an output "efghi" which includes the delay of the time constant of the electric circuit. The small delay "hi" depends on the time constant. The output of FIG. 1's PD, however, is followed by a longer tail J (hj). The big tail J originates from the diffusing holes yielded by the extra rays entering the peripheral part 10 of the light receiving layer 2. The delay time "ij" caused by the tail current is several hundreds of nanoseconds(ns).

This means that the extinction of the obstacle tail current requires hundreds of nanoseconds. The tail is a serious obstacle for the PD of fast signal rates. The tail is a more serious hazard to analog signals than digital signals.

The tail-current rather causes a hard problem on monitoring PDs which are employed for monitoring the output power of LDs in LD modules. For example, there is a monitoring PD which accompanies a fast LD oscillating at 1 GHz. The repetition cycle of pulses is 1 ns. An on-time is 500 ps and an off-time is 500 ps. But the tail-current continues for a longer time of microseconds ($\mu$s) in the monitoring PD. The photocurrent keeps flowing at the off-time by the tail-current. The tail-currents generated by a plurality of pulses overlap together. Thus the power detected by the PD is larger than the actual LD power. The tail-current hinders the PD from monitoring the correct output power of the LD.

Improvement plans have been proposed for solving the difficulty. One improvement proposed is to cover the periphery 10 with an opaque material, e.g., a metal mask, for forbidding extra rays from going into the periphery 10 of the PD chip. It is a primitive improvement. However, such a proposal has not been practiced due to the cost enhancement by an increase of an extra step and an increase of a metal material. Another proposed improvement is to cover the PD chip with a dielectric film of a 100% refractive index by piling reciprocally two kinds of dielectric films (e.g. amorphous silicon a-Si and silicon nitride SiN) having different refractive indices and different thicknesses. This proposal has not been also practiced yet due to increase of the wafer process.

Another proposal is to annihilate the extra carriers generated at the periphery. FIG. 3 shows a prior PD which has an improvement of killing the peripherally-generated carriers. This structure is called a diffusion shield structure which was first disclosed by Japanese Patent Laying Open No. 4-111479 (Japanese Patent Application No. 2-230208) by the same applicant as the present invention. The PD has a first p-region 3 and a first pn-junction u—u at the center, and further a second extra p-region 15 and a second pn-junction 17 around the central p-region 3. The second p-region 15 and the second pn-junction 17 expand to the sides of the PD chip. The holes yielded at the periphery by the outer extra incidence rays are annihilated by the second pn-junction 17. The number of the holes which can arrive at a first depletion layer 6 is decreased. The side exposed diffusion shield layer prevents the tail photo current.

The diffusion shield type PD in FIG. 3 and FIG. 4 has an n-type substrate 1 and an n-type light receiving layer 2 which is epitaxially piled on the substrate 1. The p-region 3 is formed at the center of the light receiving layer 2 by diffusing zinc (Zn). The second p-region 15 is formed at the periphery of the light receiving layer 2 concentrically to the first p-region 3. Both the first p-region 3 and the second p-region 15 are produced at the same time by diffusing Zn through a mask. A p-electrode 4 is formed on the central p-region 3. An n-electrode 5 is formed on the bottom of the n-substrate 1. The p-electrode (anode) 4 and the n-electrode (cathode) 5 are reversely biased. The central depletion layer 6 is increased by the reverse bias. No bias is applied to the second p-region 15 to the contrary. A natural, narrow depletion layer 16 accompanies the second p-region 15. It is called a "diffusion shield depletion layer" 16 or a "peripheral depletion layer" for discriminating it from the central depletion layer 6. The second pn-junction 17 is called a "diffusion shield pn-junction" or a peripheral pn-junction. Of course, the diffusion shield depletion layer 16 is thinner than the central depletion layer 6.

If outer leak rays make pairs of electron and hole in a peripheral part 10 of the n-light receiving layer 2 which is sandwiched between the neighboring depletion layers 6 and 16, the electrons as majority carriers remain there and holes 9 as minority carriers diffuse to thinner portions. Few of the holes 9 reach the central depletion layer 6. Most of the holes 9, however, diffuse to the peripheral depletion layer 16. The inherent electric field carries the holes 9 to the peripheral p-region 15. The holes are extinguished there naturally. Why are the holes extinguished in the p-region 15? If the diffusion shield p-region 15 were connected by a wire to the n-electrode 5, a current flows from the p-region 15 to the n-electrode 5 via the wire for extinguishing the holes. It is a matter of course. But the fabrication of a p-electrode on the peripheral p-region 15 would raise the cost through an increase of the steps. However, the holes vanish in practice without such an external short-cut circuit.

The reason is explained. The diffusion shield p-region 15 exposes to the sides of the PD chip. The sides of the PD chip are not covered with dielectric films. The pn-junctions 17 on the sides are not protected by the film. Carriers can flow across the pn-junction without the protection film. Thus, the pn-junction without a covering film is substantially short-circuited. The sides of the pn-junction 17 are imperfect. The imperfection of the pn-junction 17 allows the holes to flow from the p-region 15 to the n-type light receiving layer 2. The short-circuit cancels the holes diffused to the p-region 15 from the n-type light receiving layer 2. The pn-junction 17 which is exposed to the sides without protection may be called a self-shortcircuit or an inner short-circuit. The uncovered pn-junction 17 has a merit of dispensing with an external circuit for vanishing the extra holes.

The diffusion shield layer was advantageous for suppressing the tail current. The diffusion shield p-region is made together with the central p-region by a modified mask having the peripheral holes in addition to the central holes.

Since the peripheral p-region is simultaneously made by the step of making the central p-region, the step of fabrication is not increased for the improvement. The meaning of the word "diffusion shield" is now clarified. The diffusion shield signifies to make an extra p-region by the Zn-diffusion for hindering the holes from moving by the peripheral diffusion shield layer. Alternatively, the word "diffusion shield" means hindering the holes from diffusing to the central p-region.

Recent optical subscriber networks require optical receiving (PD module) sets which operate at a speed higher than 50 Mbps and have a wide dynamic range. For example, about 50 dB of 10 dBm to −40 dBm is sometimes required for the dynamic range of the PD module. The severe condition requires a further reduction of the tail-current of a PD. Although the mentioned diffusion shield layer 15 of FIG. 3 is effective, it is not satisfactory yet for the recent requirements of the wide dynamic range and the fast signal rate. Even a PD of FIG. 3 cannot expel thoroughly the tail-current. The PD of FIG. 3 cannot realize a 50 dB wide dynamic range.

SUMMARY OF THE INVENTION

One purpose of the present invention is to provide a PD which can suppress the tail-current completely by annihilating the extra carriers produced at the periphery. Another purpose of the present invention is to provide a PD module having a wide dynamic range for fast signal rates.

For annihilating the extra carriers, this invention makes a second peripheral pn-junction enclosing a first central pn-junction on a PD chip. The second p-region does not reach the sides of the PD chip. The ends of the second pn-junction do not appear on the sides. The second pn-junction has its ends within the surface. The ends of the second pn-junction are covered with a protecting film on the surface. Since the ends of the second pn-junction are protected by the film, the pn-junction is not shortcut at the ends unlike the PD of FIG. 3. The first central p-region is provided with a p-electrode. The n-substrate is provided with an n-electrode. The output signal is extracted from the central p-electrode and the n-electrode which are reversely biased. The second peripheral p-region is also provided with a peripheral p-electrode. The n-electrode and the peripheral p-electrode are also reversely biased for absorbing extra carriers generated at the periphery by the leak incidence rays. An extra depletion layer is formed beneath the peripheral p-region. The thickness of the depletion layer is increased by raising the reverse bias. The holes borne in the depletion layer are pulled to the p-region and are killed at the p-electrode by a current. The current also annihilates the extra electrons pulled in the n-region. The two sets of p-regions, pn-junctions and depletion layers are discriminated by words "central" and "peripheral" for geometrical differences. Sometimes the "peripheral" is replaced by "diffusion-shield" which denotes the function of the peripheral parts. Thus, the word "diffusion shield" is a synonym of the word "peripheral" from now onward.

Namely, the PD of the present invention has two concentric pn-junctions which are reversely biased. The central pn-junction makes a normal photocurrent of transmitted signals. The peripheral pn-junction pulls and annihilates the carriers generated by the leak rays entering the periphery of the chip. Then, the reverse bias on the peripheral pn-junction prevents the stray carriers from arriving at the central pn-junction and from making an extra photocurrent. The tail-current is eliminated from the output of the PD. Only the carriers borne at the central depletion layer by the centrally incidence rays make a photocurrent. Since the tail-current is removed, the PD is immune from the signal distortion. The PD of the present invention enjoys far faster response than the prior PD of FIG. 3. This invention gives PDs a wide dynamic range of 50 dB.

The peripheral p-regions are made simultaneously with the central p-regions by the p-dopant diffusion. The peripheral p-electrodes are also produced simultaneously with the central p-electrodes. The addition of the peripheral p-regions and the peripheral p-electrodes adds no step to the wafer process. The PDs of the present invention can be made on the same wafer process as the conventional one. The production cost is not raised by the addition of the peripheral pn-junctions and electrodes. The present invention is described on the PDs having an n-type substrate so far. But this invention can be also applied to PDs having a p-type substrate and an n-type region which are made by epitaxy or diffusion. In the case of the p-substrate PDs, all the conductive types of the substrate, epitaxial layers and electrodes should be reversed.

DETAILED DESCRIPTION OF THE PREFERRED EMBODIMENTS

Figure 5:
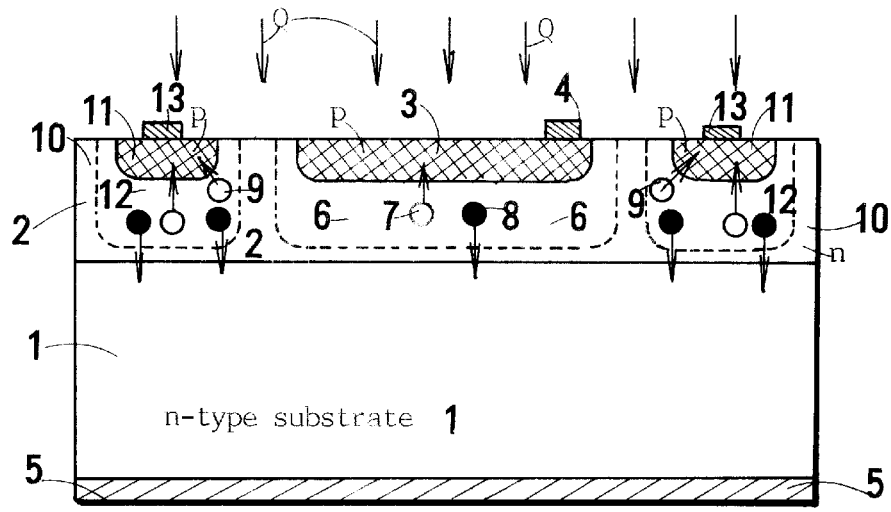
FIG. 5 is a vertical sectional view of the PD of the present invention which has double pn-junctions, double p-regions and double p-electrodes.
Figure 6:
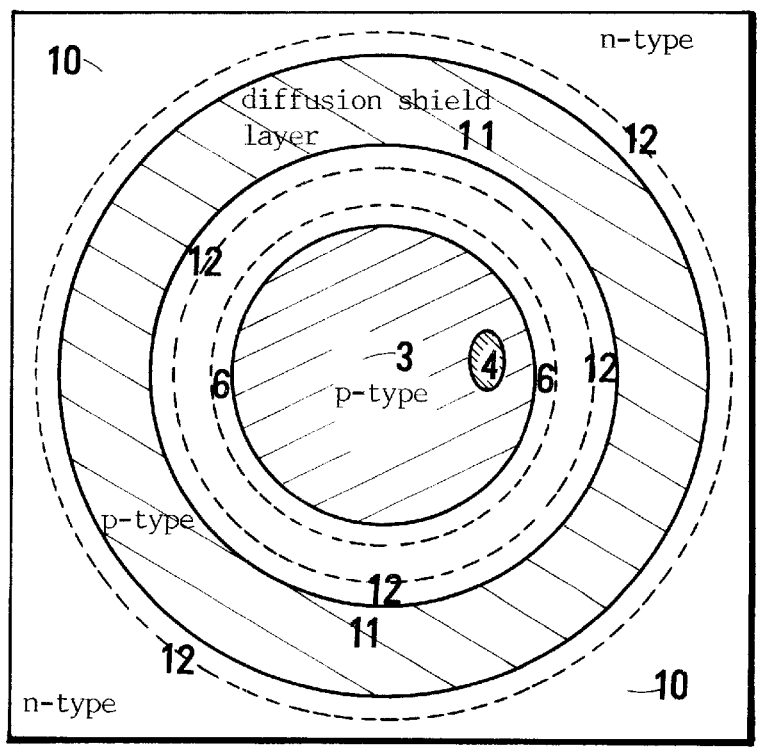
FIG. 6 is a horizontal sectional view of the same PD as FIG. 5.

This invention can be applied to both a front-surface incidence type PD and a rear-surface incidence type PD. An application to the front-surface incidence type PD is explained by referring to FIG. 5. Here, the detailed structure is omitted, since the details will be explained later. FIG. 6 is a plan view of the same front-surface incidence type PD, which omits the peripheral diffusion-shield p-electrodes.

An n-type light receiving layer 2 is epitaxially grown on an n-type single crystal substrate 1. There is a central p-region 3 produced by doping a p-dopant (e.g., Zn-diffusion) at the center of the light receiving layer 2. There is a peripheral (diffusion-shield) p-region 11 concentrically at the periphery of the light receiving layer 2. Both the central p-region 3 and the peripheral p-region 11 are simultaneously made by diffusing zinc (Zn) atoms through a pertinent mask. No extra step is introduced for making the peripheral diffusion-shield p-region 11. The p-region 11 does not extend to the sides of the PD chip. The p-region does not expose on the sides of the PD. The outermost part is the n-type light receiving layer which is immune from the p-dopant diffusion, as shown in FIG. 6. This is one of the features of the present invention different from the prior PD of FIG. 3 and FIG. 4.

A dot-shaped signal p-electrode 4 is formed upon the central p-region 3. The p-electrode 4 can be replaced by an annular electrode having an aperture for the incidence of light instead of the dot-shaped electrode. The peripheral p-region 11 has an annular p-electrode 13 for removing unnecessary carriers. The p-electrodes 4 and 13 can be simultaneously fabricated by using a modified mask. The existence of the peripheral p-electrode 13 does not increase the step of making the p-electrode in comparison with the prior PD without the extra p-electrode 13. The bottom of the n-type substrate 1 is equipped with an overall n-electrode 5.

Unlike the small dot central p-electrode 4, the peripheral p-electrode 13 is a wide annular electrode. A central depletion layer 6 is made around the central p-region 3 by the reverse bias. As explained before, the central pn-junction is included within the depletion layer 6. But the pn-junction is substantially equal to the boundary (solid line) of the p-region 3 due to the carrier-denser p-region and the carrier-thinner n-region. Another ring (diffusion-shield) depletion layer 12 is formed around the peripheral p-region 11. The reverse bias increases the thickness of the diffusion-shield depletion layer 12. A peripheral pn-junction is generated within the peripheral ring depletion layer 12. An n-depletion layer and a p-depletion layer extend downward and upward from the pn-junction. The total peripheral depletion layer 12 is a sum of the n-depletion layer and the p-depletion layer. But the p-depletion layer is very thin due to the high carrier density. Thus, the peripheral pn-junction is substantially equal to the boundary (solid line) of the peripheral p-region 11.

The diffusion-shield depletion layer 12 and the diffusion-shield pn-junction do not appear on the sides of the PD chip. This is a novel point in comparison with the prior PD of FIG. 3 and FIG. 4. Ends of the diffusion-shield pn-junction appear on the surface. The accompanying depletion layer 12 finishes within the surface of the chip. The ends of the pn-junction and the depletion layer 12 are fully protected with a protection film which is not shown in FIG. 5 but appears in FIG. 7.

Figure 2:
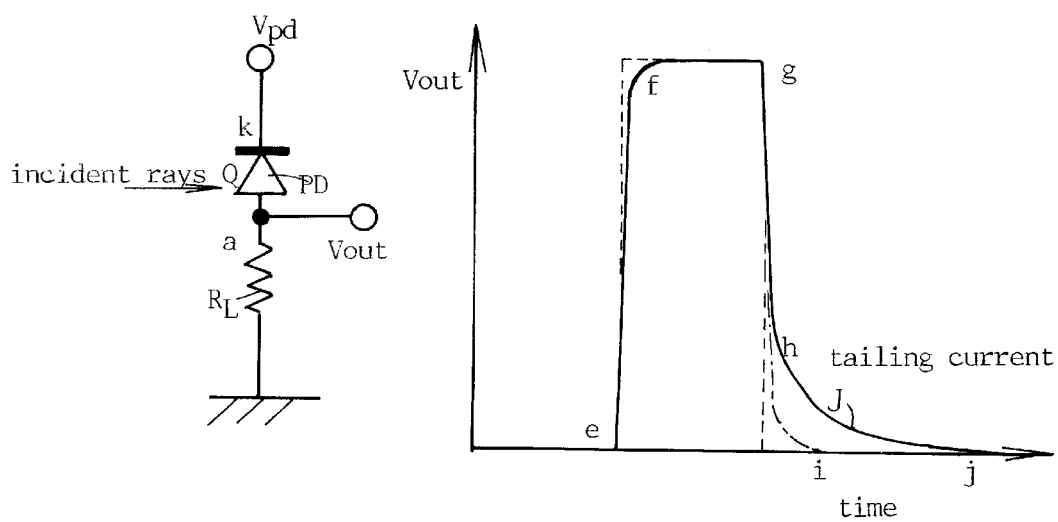
FIG. 2(a) is an electric circuit for driving a photodiode.
FIG. 2(b) is an output of the conventional PD for a pulse input for showing a tail photocurrent accompanying the signal pulse.
Figure 3:
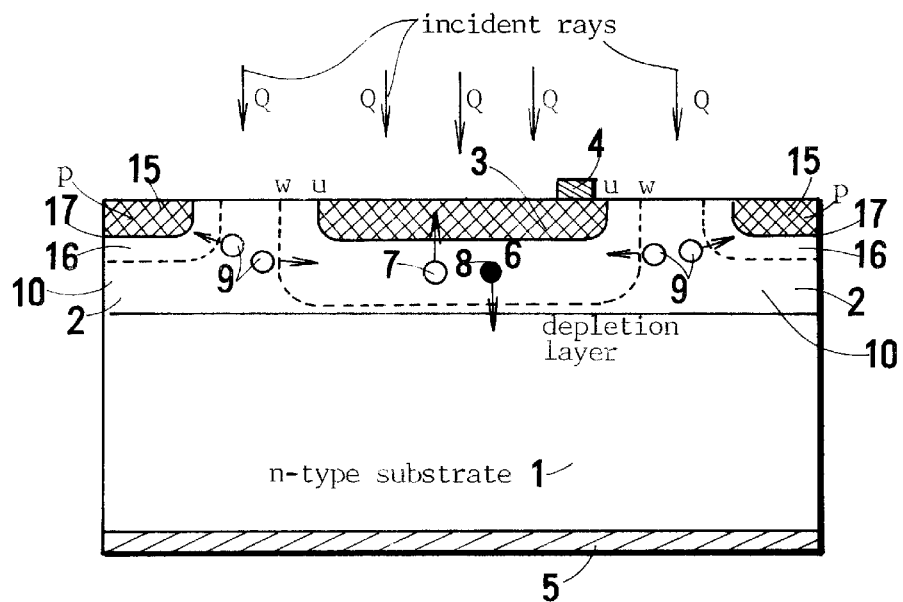
FIG. 3 is a vertical sectional view of a prior photodiode (Japanese Patent Laying Open No. 4-111479) proposed by the same applicant as the present invention.
Figure 4:
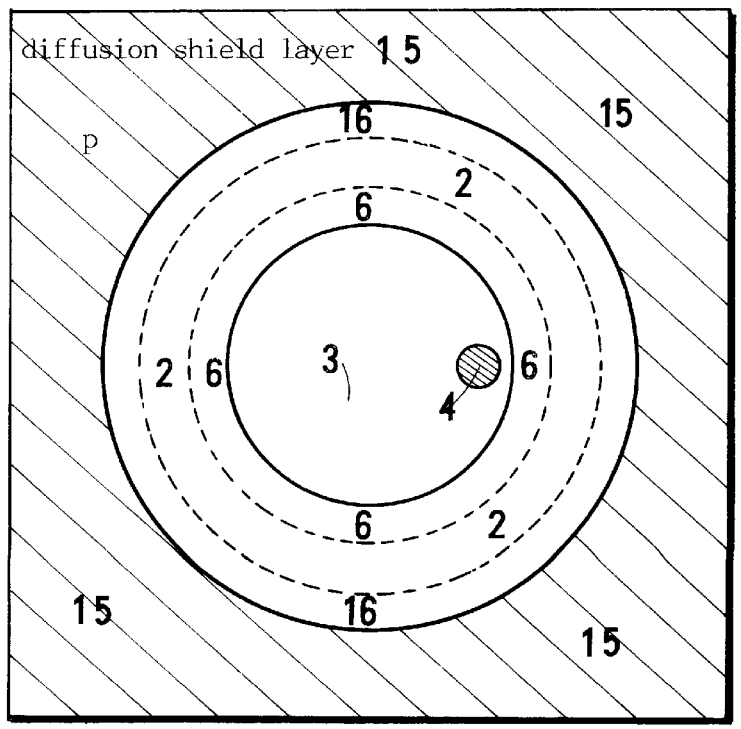
FIG. 4 is a horizontal sectional view of the same PD as FIG. 3.

The prior PD of FIG. 3 and FIG. 4 has the peripheral p-region 15 and pn-junction which reveal on the sides of the chip. The exposure of the pn-junction allows the carriers to pass the pn-junction in the reverse direction. The self-shortcircuit of the exposed pn-junction cancels the carriers made at the periphery and suppresses the tail-current J of FIG. 2(b). Since the extra carriers flow and vanish by the self-shortcircuit of the side exposed pn-junction, the prior PD requires no external circuit for canceling the extra carriers. The self-shortcircuit was a convenient property of the prior PD of FIG. 3 and FIG. 4.

The present invention, however, separates the pn-junction and the depletion layer 12 from the sides of the chip. The self-shortcircuit occurs no more at the peripheral pn-junction in the PD of the present invention.

Instead of the side exposed pn-junction, this invention connects an extra power source between the n-electrode 5 and the peripheral p-electrode 13 for applying a reverse bias to the pn-junction and making a wide depletion layer. The reverse bias power source can cancel the extra carriers by making a current in an external circuit. Thus, the PD of the invention requires a power source and a circuit for applying the reverse bias. It is not a drawback of the PD. The reverse bias expands the depletion layer 12. The depletion layer 16 of FIG. 3 is a lean, natural depletion layer which has a weak attraction power for holes. This invention positively expands the thickness of the depletion layer for enlarging the power of attracting the extra holes. The thickness (s+t) of the depletion layer increases in proportion to the square root of the reverse bias, as shown in Eq.(1) to Eq.(3). The peripheral depletion layer 12 in FIG. 5 is larger and stronger than the natural depletion layer 16 in FIG. 3. The peripheral depletion layer 12 in FIG. 5 can attract more powerfully the obstacle holes which have been generated by the light entering the peripheral n-region 10.

Since the peripheral depletion layer 12 extends in the direction of the thickness, the probability of producing pairs of electron and hole is enhanced by the increase of the depletion layer. But the carriers produced at the periphery are all annihilated by the current flow induced by the reverse bias. Thus, none of the extra carriers flow in the central p-electrode 4. The reverse bias separates and kills the extra carriers. The tail-current can fully be eliminated by the reverse bias in the PD.

The reverse bias applied between the n-electrode 5 and the peripheral p-electrode 13 is a controllable variable. The controllability is enhanced by the existence of the variable. Namely, the reverse bias can be changed in accordance with the purpose.

What is the intrinsic difference between the present invention and the prior PD of FIG. 3? Can this invention be obtained by adding a p-electrode on the peripheral p-region 15 and by applying a reverse bias between the p-electrode and the bottom n-electrode 5 in FIG. 3? It is, of course, wrong. The prior PD of FIG. 3 has a self-shortcircuited pn-junction which exposes on the side without protection. The self-shortcircuit is a strong point as well as a weak point of the prior PD. If a power source tries to apply reverse bias between the n-electrode and the peripheral p-electrode, the self-shortcircuit of the pn-junction impedes the reverse bias to rise beyond a certain low voltage by allowing a reverse current to flow (n→p). The depletion layer cannot increase over the natural thickness in spite of the reverse bias. The poor, thin depletion layer cannot effectively catch the obstacle carriers. Some carriers escape from the reverse bias and succeed in arriving at the central p-region 3 for making the tail current J. The diffusion shield of the prior PD is imperfect.

The present invention gives ends appearing on the surface to the peripheral pn-junction and covers the ends of the pn-junction with a dielectric protection layer ($SiO_2$ or SiN). The pn-junction is perfect. The pn-junction is no more self-shortcircuited. The shortcircuit is eliminated from the pn-junction. The banishment of the shortcircuit enhances the reverse breakdown voltage of the peripheral pn-junction. Any high reverse bias can be applied to the pn-junction by raising the voltage of the extra power source. The high reverse bias enhances the power of catching extra carriers by enlarging the depletion layer 12. This invention is still different from the prior PD of FIG. 3 and FIG. 4 in the perfection of the peripheral pn-junction, even if a p-electrode were to be mounted for applying a reverse bias to FIG. 3's PD. FIG. 5 and FIG. 6 denote a front-surface incidence type PD of the present invention. This invention can be also applied to a rear-surface incidence type PD which is explained by referring to FIG. 9 and FIG. 10.

EMBODIMENT 1
(Front-surface Incidence Type PD)

Figure 7:
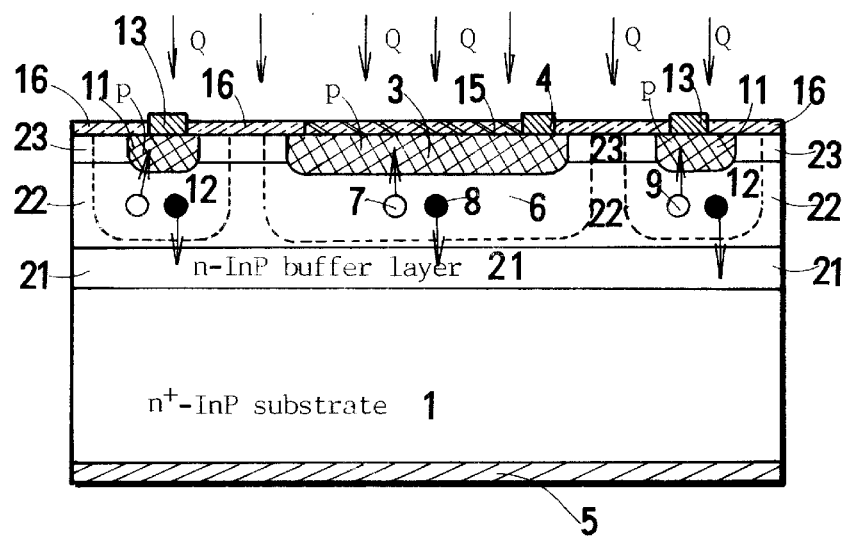
FIG. 7 is a vertical sectional view of a front surface incidence type PD as an embodiment of the present invention.
Figure 8:
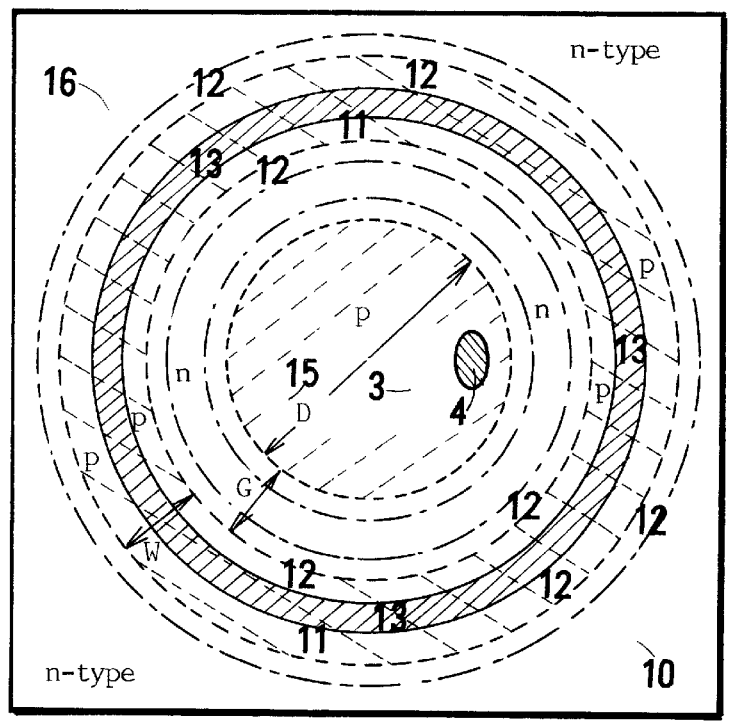
FIG. 8 is a horizontal sectional view of the same front surface entrance PD as FIG. 7.

FIG. 5 is a simplified, basic PD structure of the present invention for clarifying the novel points. The epitaxial structure actually comprises a plurality of films besides the light receiving layer. The surface of a chip is protected by a protection film. FIG. 7 and FIG. 8 show embodiment 1 of the front-surface incidence type PD.

Figure 1:
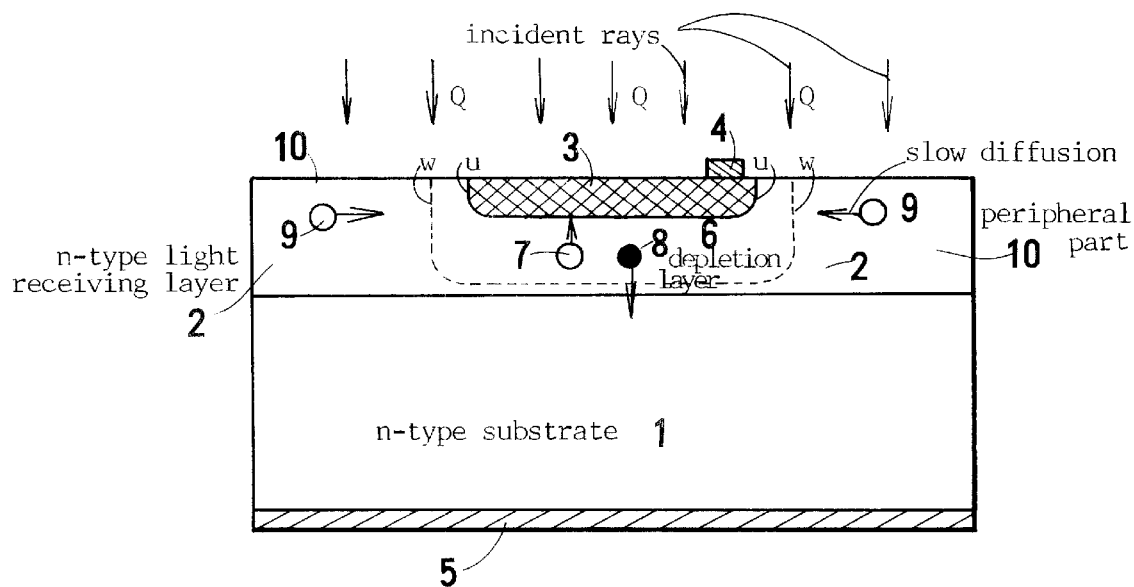
FIG. 1 is a vertical sectional view of a conventional photodiode (PD) explaining that the carriers induced by the peripheral incidence rays slowly diffuse to the central p-region and make an extra photocurrent which is the origin of the tail of the signal.

A starting wafer is a sulfur(S)-doped $n^+$-InP wafer 1. An n-InP buffer layer 21, an $n^-$-InGaAs light receiving layer 22 and an n-InP window layer 23 are epitaxially grown on the S-doped $n^+$-InP wafer 1 in turn. The set of the epitaxial layers 21, 22 and 23 is represented as an n-type light receiving layer 2 in FIG. 1, FIG. 3 and FIG. 5. The thicknesses ($\mu$m) and the carrier concentrations ($cm^{-3}$) of each epitaxial layer are,

| | | |
|---|---|---|
| $n^+$-InP substrate | 350 $\mu$m | n = 1~5 × $10^{18}$ $cm^{-3}$ |
| n-InP buffer layer | 2 $\mu$m | n = about 1 × $10^{15}$ $m^{-3}$ |
| $n^-$-InGaAs light receiving layer | 4 $\mu$m | n = about 1 × $10^{15}$ $cm^{-3}$ |
| n-InP window layer | 2 $\mu$m | n = 5 × $10^{15}$ $cm^{-3}$ |

A mask is fabricated on the epitaxial wafer by depositing a silicon nitride (SiN) film on the wafer and making central openings at centers of chips and annular openings at peripheries of chips by photolithography. Zn is thermally diffused through the mask by the closed tube method for converting the uncovered n-type regions into p-type regions. The Zn atoms diffuse beneath the mask edges in addition to the openings. The single diffusion step makes the first central p-regions 3 (first pn-junction) and the second peripheral p-regions 11 (second pn-junction) at a stroke. The p-regions have the carrier (hole) concentration of p-region (center, periphery) p=$10^{18}$~$10^{19}$ $cm^{-3}$.

The SiN mask, which has been used for making the p-regions by diffusing Zn, is left unremoved as a protection layer 16 for protecting the ends of the pn-junctions on the surface. Au (Gold) p-electrodes 4 and 13 are fabricated on the central p-regions 3 and the peripheral p-regions 11. The preferable diameter D of the central p-region 3 generally depends upon the response rate required for the PD. The favorable diameters of the central p-region 3 are, (a) a monitoring PD accompanying an LD D=200 $\mu$m~300 $\mu$m.
(b) a signal receiving PD of hundreds Mbps D=100 $\mu$m~80 $\mu$m. The gap G between the central p-region 3 and the peripheral p-region 11 is, gap G=10 $\mu$m~30 $\mu$m.

The width W of the peripheral ring p-region 11 is, ring width W=50 $\mu$m~100 $\mu$m.

The central p-electrode 4 is a small dot electrode in FIG. 8. The central p-electrode 4 can be replaced by an annular electrode having an enough aperture. The second peripheral p-region 11 and p-electrode 13 are concentric annuli here. But the peripheral p-region 11 and p-electrode 13 can take a shape of elliptical rings or square rings. If the PD detects directly the light emitted from an LD, an elliptical central p-region 3 and an elliptical peripheral p-region 11 may be more suitable than circular p-regions. The central p-region 3 is covered with an antireflection film 15 of SiNO. The antireflection film 15 is a $\lambda$/4 film for infrared light of 1.3 $\mu$m. In general, the incidence light is near infrared light of a wavelength between 1.3 $\mu$m and 1.55 $\mu$m. An Au n-electrode 5 is made on the bottom of the n+-InP substrate 1. What restricts the wavelength of receivable light is the materials of the window layer 23 and the light receiving layer 22. This example employs an InP window layer and an InGaAs light receiving layer. The scope of receivable wavelengths is changed by replacing the window layer by InGaAs and the light receiving layer with InGaAsP.

A signal power source reversely biases the central p-electrode 4 and the n-electrode 5. A tail-current annihilating power source is connected to the peripheral p-electrode 13 and the n-electrode 5 for applying a strong reverse bias to the depletion layer 12. A powerful electric field stands from the n-region to the p-region in the depletion layer 12.

Passing the front surface antireflection film 15 and the p-region 3, incidence rays Q generate pairs of electron and hole in the central depletion layer 6. The electrons 8 run to the n-substrate 1 and the holes 7 run to the p-region 3 by the electric field. When the electron arrives at the n-region, a unit photocurrent flows. When the hole reaches the p-region, another unit photocurrent flows. This is the signal photocurrent. Similarly, passing the protection film 16, peripheral-incidence rays make pairs of electrons and holes in the peripheral depletion layer 12. The electric field carries the electrons 12 to the n-region and the holes 9 to the p-region 11. The electrons and holes make an extra photocurrent. But the extra photocurrent flows in the tail-current annihilating power source without make an influence on the signal current. Namely, the tail-current is removed by the tail-current annihilating power source. The PD realizes a fast rise and fall "efgi" of the output in FIG. 2(b). The small delay "gi" originates from the electric circuit.

EMBODIMENT 2
(Rear-surface Incidence Type PD)

Figure 9:
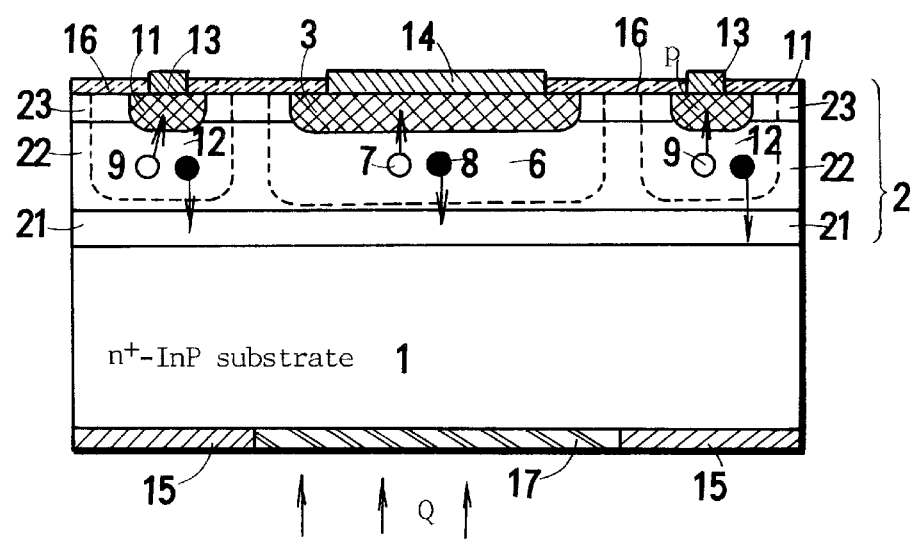
FIG. 9 is a vertical sectional view of a rear surface incidence type PD as another embodiment of the present invention.
Figure 10:
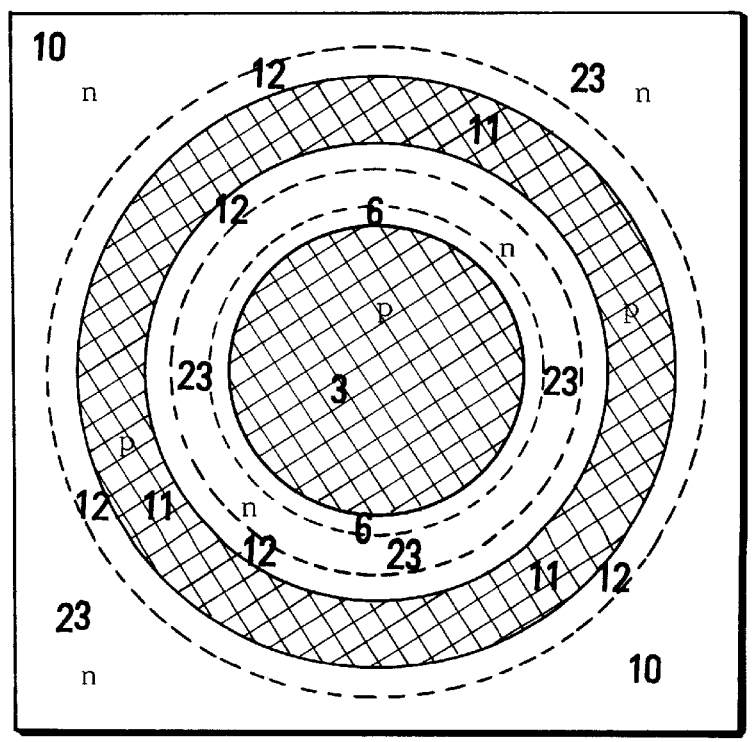
FIG. 10 is a horizontal sectional view of the same rear surface entrance PD of FIG. 9.

FIG. 9 is a vertical sectional view of a rear-surface incidence type PD as embodiment 2. FIG. 10 is a horizontal view of the same PD. An n-InP buffer layer 21, an n⁻-InGaAs light receiving layer 22 and an n-InP window layer 23 are epitaxially deposited on an n⁺-InP substrate 1. Central p-regions 3 and peripheral p-regions 11 are made by diffusing zinc atoms through a SiN mask 16 having central apertures and peripheral apertures. The steps till now are similar to embodiment 1.

Since signal rays do not go into the front surface, the whole central p-region 3 is covered with an Au central p-electrode 14. The peripheral p-region 11 is provided with an Au peripheral p-electrode 13. The front surface of the PD chip is fully covered with the protection layer 16 or the p-electrodes 14 and 13. The bottom film structure is made by depositing an n-electrode 15 on the bottom of the n+-InP substrate 1, eliminating a central part of the n-electrode 15 and coating the central opening with an antireflection film 17 made from e.g., SiNO.

A signal power source reversely biases the central p-electrode 14 and the bottom n-electrode 15 for establishing an electric field in a central depletion layer 6. Similarly, the peripheral p-electrode 13 and the n-electrode 15 are reversely biased by a tail-current annihilating power source.

Passing the antireflection film 17 on the bottom surface, most of the incidence rays Q propagate in the n+-InP substrate 1, the n-InP buffer layer 21, and the n⁻-InGaAs light receiving layer 22 and finally arrive at the central depletion (InGaAs) layer 6. The depletion layer 6 absorbs the rays and makes electrons 8 and holes 7. The electric field conveys the electrons 8 to the n-region and the holes 7 to the p-region. A signal photocurrent is produced by the electrons and holes.

A part of the incidence rays arrive at the peripheral depletion layer 12 for making electrons and holes 9. The holes 9 make an extra photocurrent at the peripheral p-region 11. The electrons make another extra photocurrent at the n-light receiving layer 22. But the extra photocurrents are absorbed by the tail-current annihilating power source and are excluded from the signal. The tail-currents are fully expelled.

EMBODIMENT 3
(PD Driving Circuit Having Two Power Sources)

Figure 11:
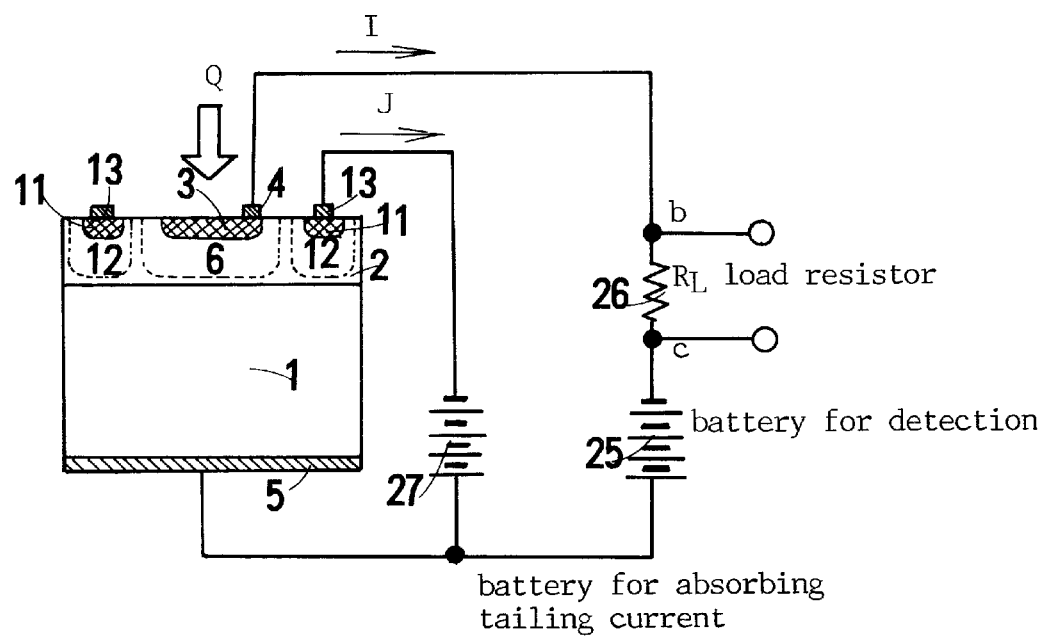
FIG. 11 is an example of a circuit having two sources for driving the PD of the present invention.

FIG. 11 is an example of a PD driving circuit having two power sources. Though FIG. 11 denotes a front-surface incidence type PD, the same circuit can be applied to a rear-surface incidence type PD. A signal power source 25 is connected in series to a load resistor ($R_L$) 26 at the minus terminal. The plus terminal is connected to an n-electrode 5. The load resistor 26 is connected to a central p-electrode 4.

An independent power source 27 is employed for annihilating the tail-current in addition to the signal power source 25. The plus terminal is connected to the n-electrode 5. The minus terminal is connected to a peripheral p-electrode 13. The extra power source 27 forms a deep depletion layer 12 beneath a peripheral p-region 11 by applying a strong reverse bias. The extra power source 27 can be substituted by the signal power source 25 by connecting point c to the p-electrode 13 and eliminating the power source 27. The common power source is effective to alleviate the cost of the PD module.

Incident rays Q make carriers in the central depletion layer 6 which induce a signal current I flowing in the load resistor ($R_L$) 26. The photocurrent I is detected by the small voltage appearing between points b and c of the load resistor 26. In reality, the b-c voltage is amplified by a following amplification circuit.

Some rays arrive at the peripheral depletion layer 12. The leak rays make extra carriers which cause a current J flowing via the p-electrode 13. The current J is annihilated in the separate power source 27. Thus, the power source 27 eliminates the tail current J (FIG. 2(b)) from the signal.

A gist of the present invention is the tail-current annihilating power source 27 which absorbs positively the tail-current from the signal. The tail-current annihilating power source 27 can enlarge the depth of the depletion layer 12 by applying a strong reverse bias to the peripheral p-region 11. The depth and the width of the peripheral depletion layer 12 are controllable variables, although embodiment 3 requires the additional power source 27. The fabrication of the PD chips requires no extra steps other than similar steps of making the conventional PDs of FIG. 1. The peripheral p-region 11 and p-electrode 13 can be fabricated simultaneously with the central p-region 3 and p-electrode 4 at a stretch.

EMBODIMENT 4
(PD Driving Circuit Combined With an Amplifier)

Figure 12:
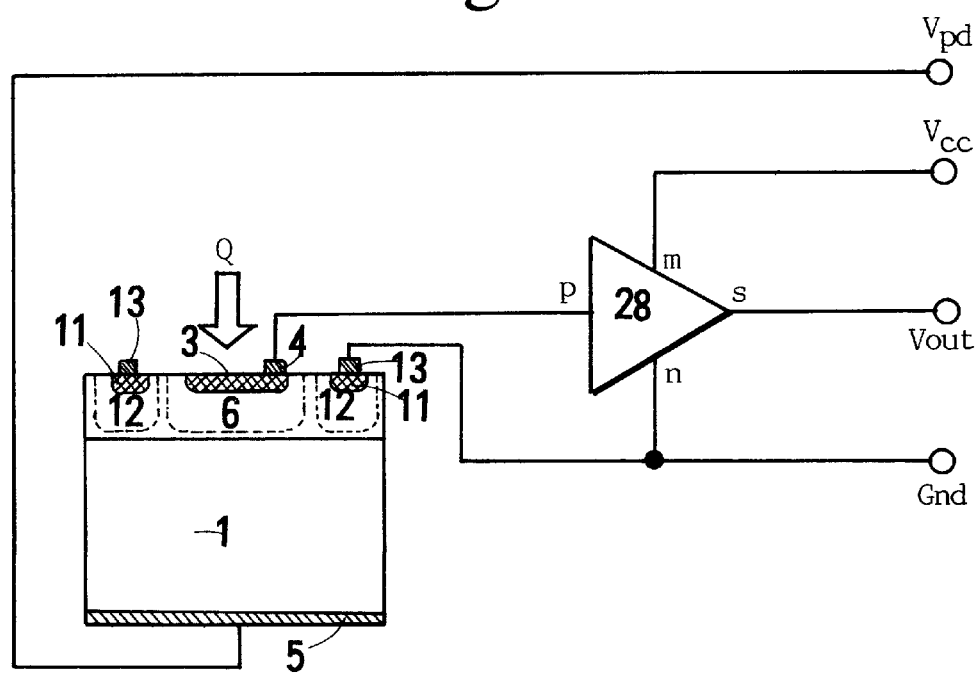
FIG. 12 is an example of a circuit having a preamplifier for amplifying the photocurrent of the PD.

Since the photocurrent of a PD is weak, the current should be amplified. FIG. 12 is a PD driving circuit having an amplifier 28. An n-electrode 5 is coupled to Vpd pin. Source pin m of the amplifier 28 is connected to Vcc pin. Ground pin n of the amplifier 28 is connected to a p-electrode 13 and Gnd pin. A central p-electrode 4 is coupled to input pin p of the amplifier 28. Output pin s of the amplifier 28 appears at Vout pin.

A tail-current annihilating power source is connected between Vpd and Gnd. A signal power source is connected between Vcc and Gnd. In this embodiment, one power source can be omitted by connecting both Vpd and Vcc to a single power source for alleviating the cost.

EMBODIMENT 5
(PD-AMP Package-in Type)

Figure 13:
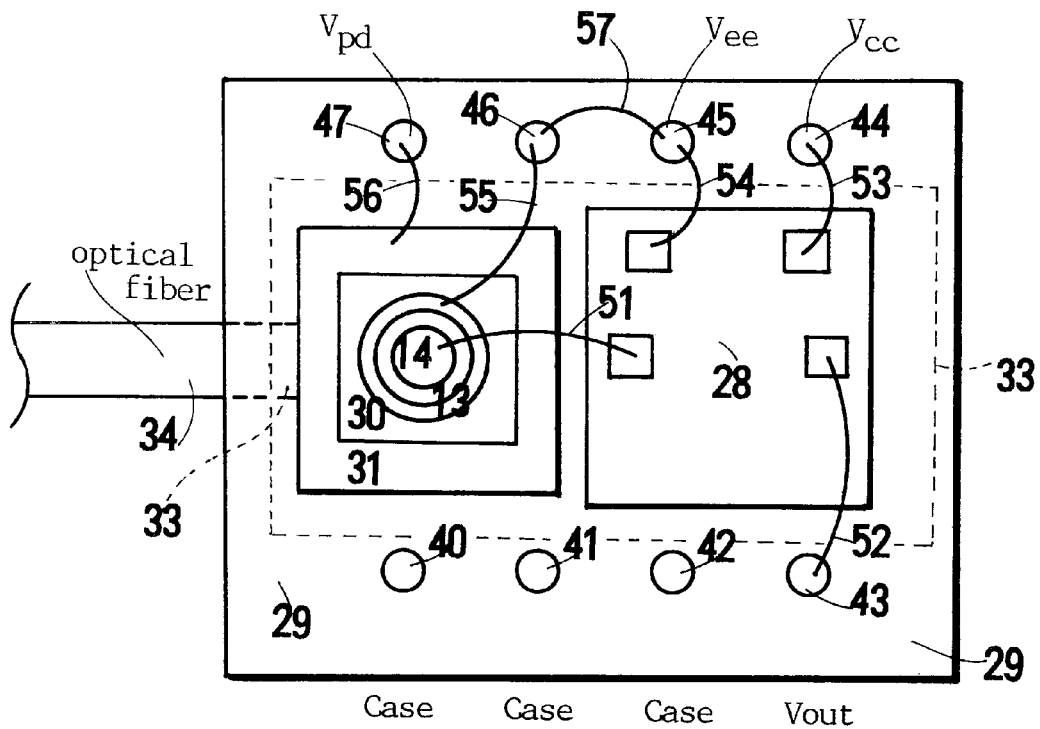
FIG. 13 is a plan inner view of a package having a PD and a preamplifier.
Figure 14:
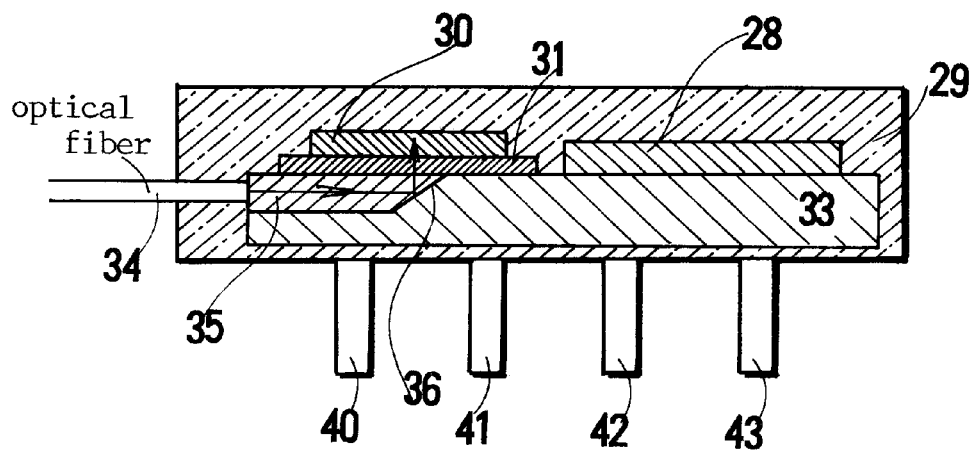
FIG. 14 is a side view of the same package storing the PD and the preamplifier as FIG. 13.

FIG. 13 and FIG. 14 demonstrate more concrete embodiment 5 having a PD 30 and a preamplifier (AMP) 28 in a package 29. The PD chip 30 is a rear-surface incidence type PD having a circular central p-electrode 14 and a concentric circular peripheral p-electrode 13 on the top and an annular n-electrode on the bottom. The n-electrode does not appear in the figures. A submount 31 having an opening is fitted on a flat bench 33 e.g., of Si in the package 29. The PD 30 is mounted on the submount 31. The preamplifier chip 28 is mounted on the bench 33. An optical fiber 34 is connected to an end of a waveguide 35 in the bench 33. The light propagating in the optical fiber 34 is introduced into the waveguide 35, reflected by a mirror plane 36 and is guided into the PD 30 from the rear surface. The package 29 has pins 40 to 47. Pins 40, 41 and 42 are case pins. The central p-electrode 14 is coupled to an input pin p of the AMP 28 by a wire 51. An output pad s is coupled to Vout pin 43 by a wire 52. The source pad m is connected to Vcc pin 44 by a wire 53. A ground pad n is connected to Vee pin 45 by a wire 54. The peripheral p-electrode 13 is joined to a pin 46 with a wire 55. The top of the metallized submount 31 is coupled to Vpd pin 47 by a wire 56. A wire 57 couples the pin 46 with Vee pin 45. The end of the fiber 34, the PD 30, the AMP 28 and the bench 33 are enclosed by the plastic mold package 29.

We claim:

1. A photodiode module comprising:
    a photodiode chip having,
        an n-type semiconductor substrate,
        an n-electrode formed on the bottom of the n-type substrate;
        a n-type light receiving layer epitaxially grown on the n-type substrate, a central p-region produced at a center of the light receiving layer by diffusing a p-type dopant,
        a central pn-junction intervening between the central p-region and the n-type light receiving layer and having a ring end,
        a ring diffusion shield p-region being made by diffusing a p-type dopant in a ring region enclosing the central p-region with an outermost part of the n-type light receiving layer left undoped,
        a ring peripheral pn-junction intervening between the diffusion-shield p-region and the n-type light receiving layer and having ring ends,
        a signal p-electrode formed upon the central p-region,
        an annular diffusion-shield p-electrode formed upon the peripheral ring diffusion-shield p-region, and
        a protecting film covering the end of the central pn-junction and the ends of the peripheral diffusion-shield pn-junctions;
    a package for storing the photodiode chip;
    a signal power source for applying a reverse bias between the signal p-electrode and the n-electrode; and
    a tail-current annihilating power source for applying reverse bias between the diffusion-shield p-electrode and the n-electrode for annihilating extra carriers generated by leak rays going into a peripheral part.

2. A photodiode module as claimed in claim 1, wherein the module has an amplifier chip for amplifying the photocurrent of the photodiode chip positioned side by side of the photodiode chip in the package, and the amplifier chip obtains electric power from the tail-current annihilating power source.

3. A photodiode module as claimed in claim 2, wherein the amplifier chip has an input terminal, an output terminal, a source terminal and a ground terminal, the input terminal is connected to the central p-electrode of the PD chip, the n-electrode of the PD chip is connected to a pin Vpd, the ground terminal of the amplifier chip and the peripheral diffusion-shield p-electrode are connected to a pin Gnd, the output terminal of the amplifier is connected to a pin Vout and the source terminal of the amplifier is connected to a pin Vcc.

4. A photodiode module as claimed in claim 3, wherein the signal power source is diverted to the tail-current annihilating power source by connecting the pin Vpd with the pin Vcc.

5. A photodiode module comprising:
    a photodiode chip having,
        a p-type semiconductor substrate;
        a p-electrode formed on the bottom of the p-type substrate;
        a p-type light receiving layer epitaxially grown on the p-type substrate,
        a central n-region produced at a center of the light receiving layer by diffusing an n-type dopant,
        a central pn-junction intervening between the central n-region and the p-type light receiving layer and having a ring end,
        a diffusion shield n-region being made by diffusing an n-type dopant in a ring region enclosing the central n-region with an outermost part of the p-type light receiving layer left undoped,
        a ring peripheral pn-junction intervening between the diffusion-shield n-region and the p-type light receiving layer and having ring ends,
        a signal n-electrode formed upon the central n-region;
        a diffusion-shield n-electrode formed upon the peripheral ring diffusion-shield n-region, and
        a protecting film covering the end of the central pn-junction and the ends of the peripheral diffusion-shield pn-junctions;
    a package for storing the photodiode chip;
    a signal power source for applying a reverse bias between the signal n-electrode and the p-electrode; and
    a tail-current annihilating power source for applying reverse bias between the diffusion-shield n-electrode and the p-electrode for annihilating extra carriers generated by leak rays going into a peripheral part.

6. A photodiode module as claimed in claim 5, wherein the module has an amplifier chip for amplifying the photocurrent of the photodiode chip positioned side by side of the photodiode chip in the package.

* * * * *